United States Patent
Hata et al.

(10) Patent No.: US 7,551,436 B2
(45) Date of Patent: Jun. 23, 2009

(54) ELECTRONIC APPARATUS

(75) Inventors: Koji Hata, Yokohama (JP); Takashi Funada, Yokosuka (JP); Seiji Asai, Yokohama (JP); Susumu Miyagawa, Fujisawa (JP); Hiroshi Kuwaki, Fujisawa (JP); Takeshi Kiyose, Fujisawa (JP)

(73) Assignee: Hitachi Communication Technologies, Ltd., Tokyo (JP)

( * ) Notice: Subject to any disclaimer, the term of this patent is extended or adjusted under 35 U.S.C. 154(b) by 0 days.

(21) Appl. No.: 11/701,521

(22) Filed: Feb. 2, 2007

(65) Prior Publication Data

US 2007/0230123 A1    Oct. 4, 2007

(30) Foreign Application Priority Data

Mar. 31, 2006    (JP)    ............................. 2006-096834

(51) Int. Cl.
*H05K 5/00* (2006.01)
*H05K 7/20* (2006.01)
*G01R 31/00* (2006.01)

(52) U.S. Cl. .................. 361/695; 361/724; 361/752; 454/184; 324/502

(58) Field of Classification Search ......... 361/688–695, 361/748–760, 724; 62/259.2; 312/223.2; 211/41.17; 454/184–186; 324/502
See application file for complete search history.

(56) References Cited

U.S. PATENT DOCUMENTS

| | | | |
|---|---|---|---|
| 5,796,580 A * | 8/1998 | Komatsu et al. ............. 361/687 |
| 5,877,938 A * | 3/1999 | Hobbs et al. ................. 361/724 |
| 5,889,648 A * | 3/1999 | Heavirland et al. .......... 361/600 |
| 5,975,315 A * | 11/1999 | Jordan .......................... 211/26 |
| 6,036,290 A * | 3/2000 | Jancsek et al. ............ 312/265.4 |
| 6,072,397 A * | 6/2000 | Ostrowski .................... 340/588 |
| 6,195,493 B1 * | 2/2001 | Bridges ...................... 385/134 |
| 6,222,729 B1 * | 4/2001 | Yoshikawa ................... 361/695 |
| 6,301,108 B1 * | 10/2001 | Stockbridge .................. 361/688 |
| 6,327,155 B1 * | 12/2001 | Niepmann et al. ........... 361/757 |
| 6,370,035 B1 * | 4/2002 | De Cecco et al. ............ 361/796 |
| 6,404,629 B1 * | 6/2002 | Austin et al. ................. 361/690 |
| 6,470,289 B1 * | 10/2002 | Peters et al. .................. 702/132 |
| 6,548,753 B1 * | 4/2003 | Blackmon et al. .............. 174/50 |
| 6,597,571 B2 * | 7/2003 | Kubota et al. ................ 361/695 |
| 6,628,520 B2 * | 9/2003 | Patel et al. .................... 361/696 |
| 6,639,794 B2 | 10/2003 | Olarig et al. |
| 6,646,867 B1 * | 11/2003 | Tuttle et al. .................. 361/683 |

(Continued)

FOREIGN PATENT DOCUMENTS

JP    7-65267 A    3/1995

(Continued)

*Primary Examiner*—Jayprakash N Gandhi
*Assistant Examiner*—Bradley H. Thomas
(74) *Attorney, Agent, or Firm*—McDermott Will & Emery LLP

(57) ABSTRACT

In an electronic apparatus in which plural substrates are arranged in a perpendicular direction between plural cooling fans in a lower part of a case and plural temperature sensors in an upper part of the case, any temperature variation by 2° C. in three seconds detected by any one of the temperature sensors is determined to be abnormal, and thermal energy is caused to be discharged from surfaces of substrates on two sides of a flame by raising air flow rates of fans. Expansion of the flame to other substrates is thereby prevented.

10 Claims, 6 Drawing Sheets

U.S. PATENT DOCUMENTS

| | | | |
|---|---|---|---|
| 6,744,632 B2 * | 6/2004 | Wilson et al. | 361/695 |
| 6,927,977 B2 * | 8/2005 | Singer | 361/695 |
| 7,075,788 B2 | 7/2006 | Larson et al. | |
| 7,129,732 B1 * | 10/2006 | Knadle | 324/760 |
| 2002/0117901 A1 * | 8/2002 | Spivey et al. | 307/117 |
| 2002/0159233 A1 * | 10/2002 | Patel et al. | 361/702 |
| 2003/0146679 A1 * | 8/2003 | Gliesman et al. | 312/236 |
| 2004/0057210 A1 * | 3/2004 | Wilson et al. | 361/695 |
| 2004/0132398 A1 * | 7/2004 | Sharp et al. | 454/184 |
| 2004/0218355 A1 * | 11/2004 | Bash et al. | 361/690 |
| 2004/0264124 A1 * | 12/2004 | Patel et al. | 361/686 |
| 2005/0078449 A1 * | 4/2005 | Makooi et al. | 361/695 |
| 2005/0089027 A1 * | 4/2005 | Colton | 370/380 |
| 2005/0122680 A1 * | 6/2005 | Ozawa et al. | 361/687 |
| 2005/0269870 A1 * | 12/2005 | Ohashi et al. | 303/20 |

FOREIGN PATENT DOCUMENTS

| | | |
|---|---|---|
| JP | 8-63237 A | 3/1996 |
| JP | 9-250489 A | 9/1997 |

* cited by examiner

22

| 221 | CONTROL PROGRAM | | | |
|---|---|---|---|---|
| 222 | TEMPERATURE DATA | 1 | 2 | ... |
| | | CURRENT TIME | CURRENT TIME | ... |
| | | LAST TIME | LAST TIME | ... |
| | | PREVIOUS TIME BEFORE LAST | PREVIOUS TIME BEFORE LAST | ... |
| 223 | PRESCRIBED VALUE | Td | | |

ELECTRONIC APPARATUS

CLAIM OF PRIORITY

The present application claims priority from Japanese patent application serial no. 2006-096834, filed on Mar. 31, 2006, the content of which is hereby incorporated by reference into this application.

BACKGROUND OF THE INVENTION

The present invention relates to an electronic apparatus, and more particularly to an electronic apparatus which, when put to an ambience test in which it is exposed to a flame, can prevent the flame from expanding.

Electronic apparatuses are configured of components excelling in incombustibility to ensure safety against and reduce damages by fires. This serves to eliminate the risk for electronic apparatuses to catch fire. However, the U.S. standard under GR-63-CORE, Section 4.2.2.2 of "NEBS Requirements: Physical Protection", Telcordia Technologies, April 2002 requires that, even when an ignited burner (ignition source) is inserted into an electronic apparatus and methane gas is let in from outside to expose the printed circuit board to a flame, the fire should not propagate within the electronic apparatus. This condition of exposure to a flame is stated in "Equipment Assemblies—Fire Propagation Risk Assessment Criteria", ANSI, T1. 319-2002, pp. 13-14, wherein the maximum volume of methane gas supplied to the burner, which is dependent on the height of the printed circuit board held perpendicularly in the electronic apparatus, and the methane gas supply profile are prescribed.

In a specific methane gas supply profile, as noted in FIG. 8A, first a burner ignited with methane gas that is let in at a flow rate of 1 l/min is inserted into a space between the printed circuit boards in the lower part of the electronic apparatus (time 0). From time 15 seconds until time 1 minute 25 seconds, the flow rate is increased linearly. The flow rate, which reaches its maximum (11.6 l) at time 1 minute 25 seconds, is linearly reduced to fall to 0 l/min by time 4 minutes 30 seconds. Then, a minimum flow rate of 1 l/min is maintained, and the supply of methane gas is cut off at time 4 minutes 30 seconds. Thus, the printed circuit boards and electronic components mounted on the printed circuit boards on the two sides of the burner are exposed to a flame for 4 minutes 30 seconds. While the position of inserting the burner is prescribed to be underneath the mounted part of the printed circuit boards, its slot position can be determined by the examiner at his or her own discretion.

The specification of the U.S. Pat. No. 6,927,977 discloses an electronic apparatus whose metallic baffle disposed in the upper part of the apparatus is cooled by a blower to satisfy the aforementioned requirement.

An electronic apparatus is usually subjected to forced air cooling by the use of a cooling fan, whose speed is controlled. Cooling fan speed control is a technique by which the fan speed is normally kept slow to suppress noise and, when a temperature rise is detected by a sensor, is raised to prevent the temperature from rising. The cooling fan is intended to maintain the temperature within the apparatus from rising above a certain level, and is usually controlled on the basis of comparison of the absolute temperature level detected by the sensor arranged in the upper part of the case in accordance with a set threshold.

JP-A-250489/1997 discloses an invention according to which, in order to cool and ensure stable operation of an electronic apparatus by revolving a cooling fan at an appropriate speed, plural temperature sensors are disposed in plural positions in a box housing the electronic apparatus, and the frequency of revolutions of the cooling fan of the electronic apparatus is controlled according to temperature signals obtained from those temperature sensors. However, since the frequency of revolutions of the fan is determined according to the absolute temperature level according to this technique, application of this technique to detection of a flame would involve a problem that, the detection of flame generation will be delayed if the ambient temperature does not reach a high level in a short period of time because the flame arises when the ambient temperature of the temperature sensors is low or for any other reason.

JP-A-63237/1996 discloses a reliable cooling system for electronic devices which utilizes light emitting elements to perform cooling control to accurately address abnormal high temperature of components whose temperature is measured. This system, however, requires arrangement of a sensor in every position where temperature monitoring is desired, but hardly allows monitoring of flame occurrence with a relatively small number of temperature sensors.

JP-A-065267/1995 discloses a fire alarm which, when a predetermined temperature has been reached or a temperature rise per unit time has reached a predetermined level (25° C. per minute in an embodiment of the invention), determines the temperature change as indicating a fire accident.

SUMMARY OF THE INVENTION

An object of the present invention is to provide an electronic apparatus which can stand the stringent ambience test stated in GR-63-CORE. This object can be achieved by an electronic apparatus including plural cooling fans arranged in a lower part of a case, plural temperature sensors arranged in an upper part of the case, and plural electronic substrates arranged between the cooling fans and the temperature sensors so as to secure air flow paths, wherein an air flow rate of the plurality of cooling fans is increased when heat from an ignition source inserted between the substrates is detected by the temperature sensors as a temperature variation.

Also, the object can be achieved by an electronic apparatus including plural cooling fans arranged in the lower part of a case, plural temperature sensors arranged in the upper part of the case, and plural electronic substrates arranged between the cooling fans and the temperature sensors so as to secure air flow paths, wherein, when an igniter is inserted between the substrates, the temperature sensor detects the insertion of the igniter within 30 seconds after the insertion of the igniter and causes the air flow rate of the plurality of cooling fans to be raised.

Further, the object can also be achieved by an electronic apparatus including plural fans arranged in a lower part of a case, plural temperature sensors arranged in an upper part of the case, and plural electronic substrates arranged between the fans and the temperature sensors so as to secure air flow paths, wherein an air flow rate of the plurality of fans is raised when any variation in heat from the air flow paths between the substrates is detected by the temperature sensors as a prescribed temperature variation.

BRIEF DESCRIPTION OF THE DRAWINGS

Preferred embodiments of the present invention will now be described in conjunction with the accompanying drawings, in which.

DESCRIPTION OF THE PREFERRED EMBODIMENT

Figure 1A:
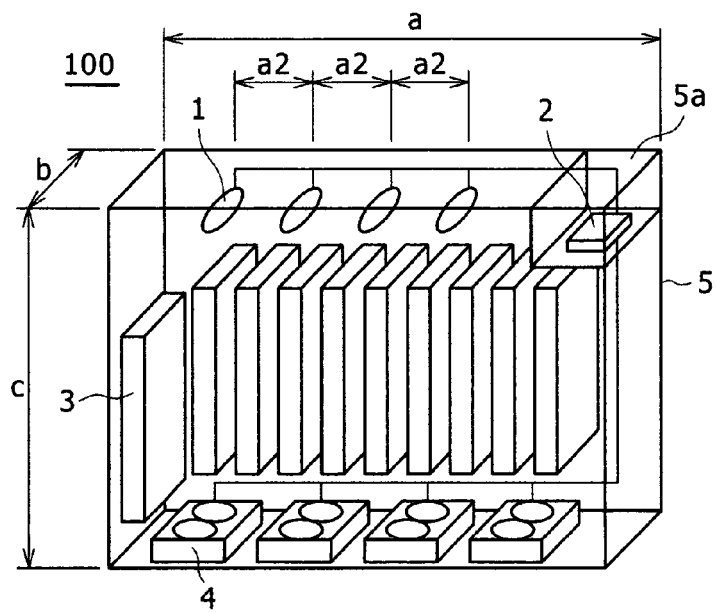
FIGS. 1A and 1B show a perspective view of an electronic apparatus.
Figure 1B:
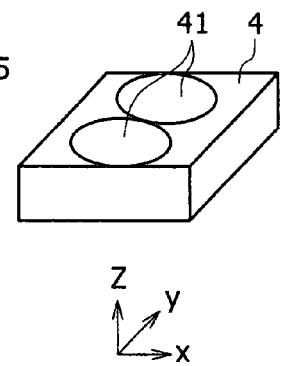
Figure 2:
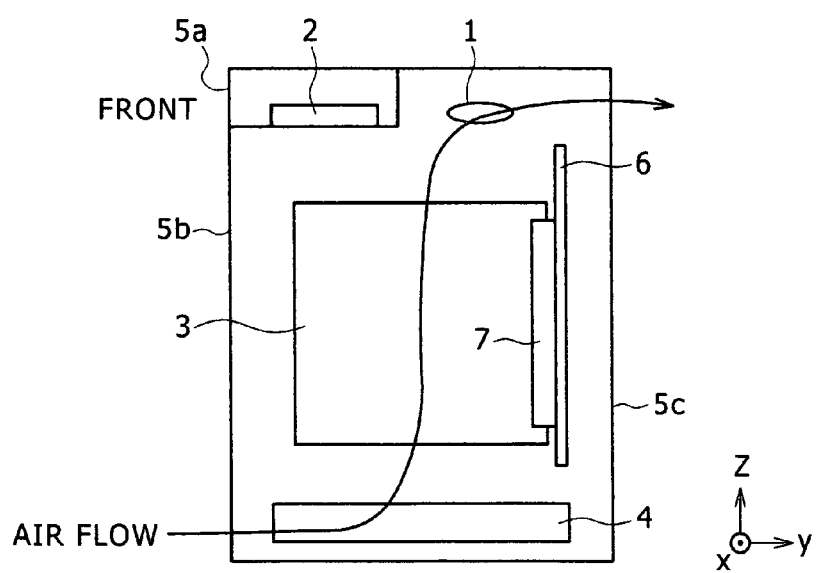
FIG. 2 shows a perspective profile of the electronic apparatus.
Figure 3:
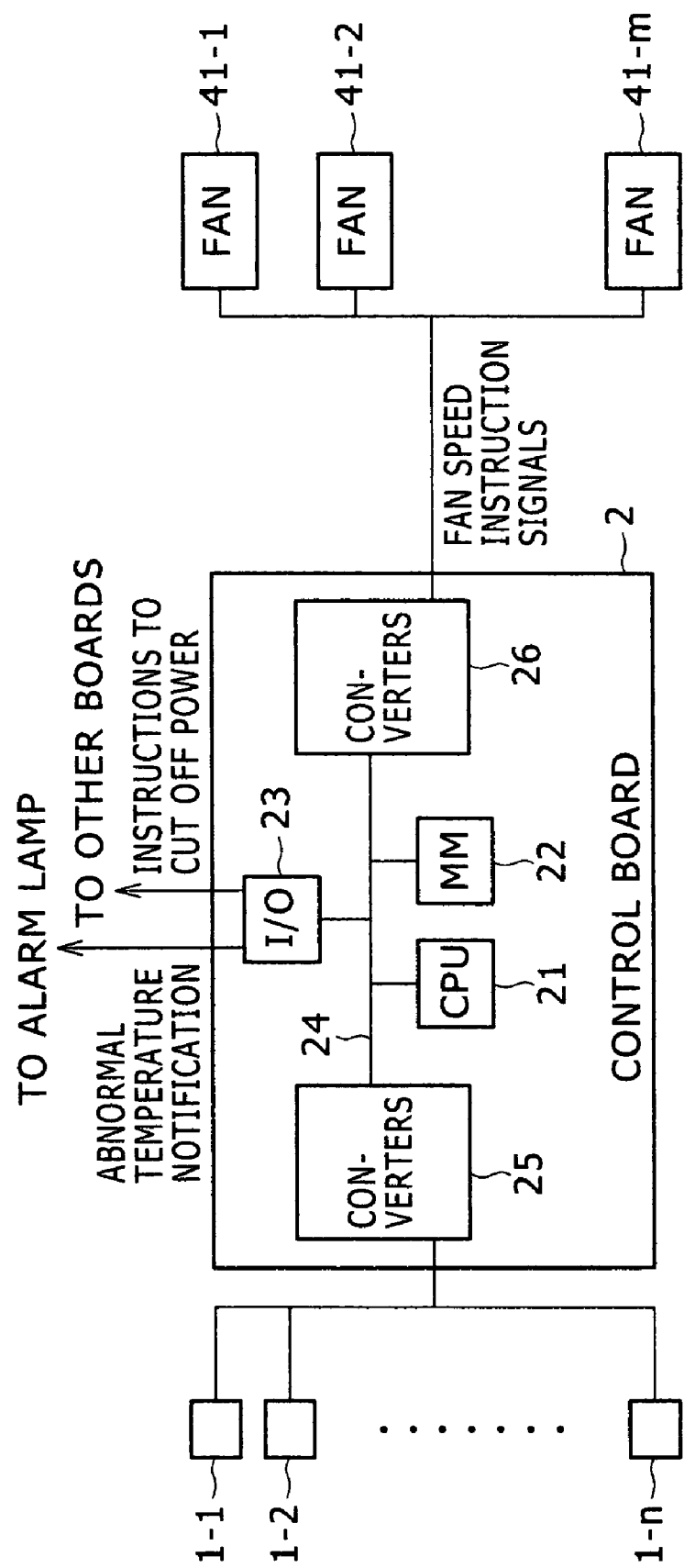
FIG. 3 is a block diagram illustrating fan control.
Figures 4, 5:
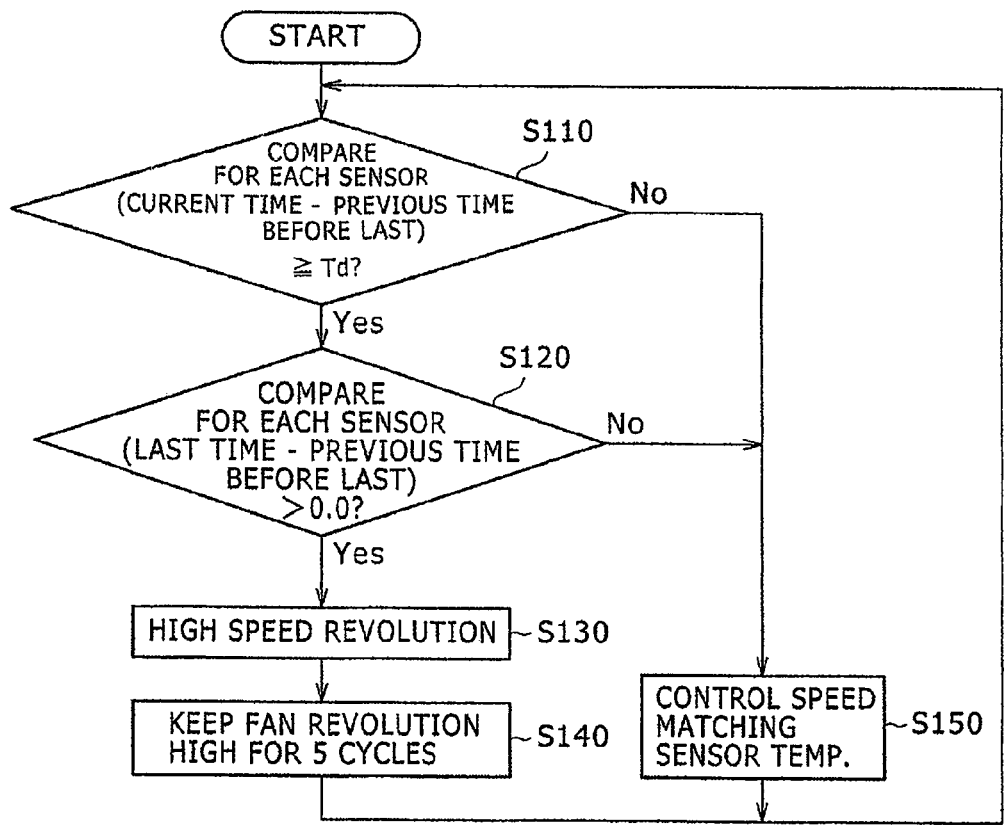
FIG. 4 is a block diagram illustrating the contents of a memory.
FIG. 5 is a flowchart illustrating control of the frequency of fan revolutions regarding determination of abnormality.
Figure 6:
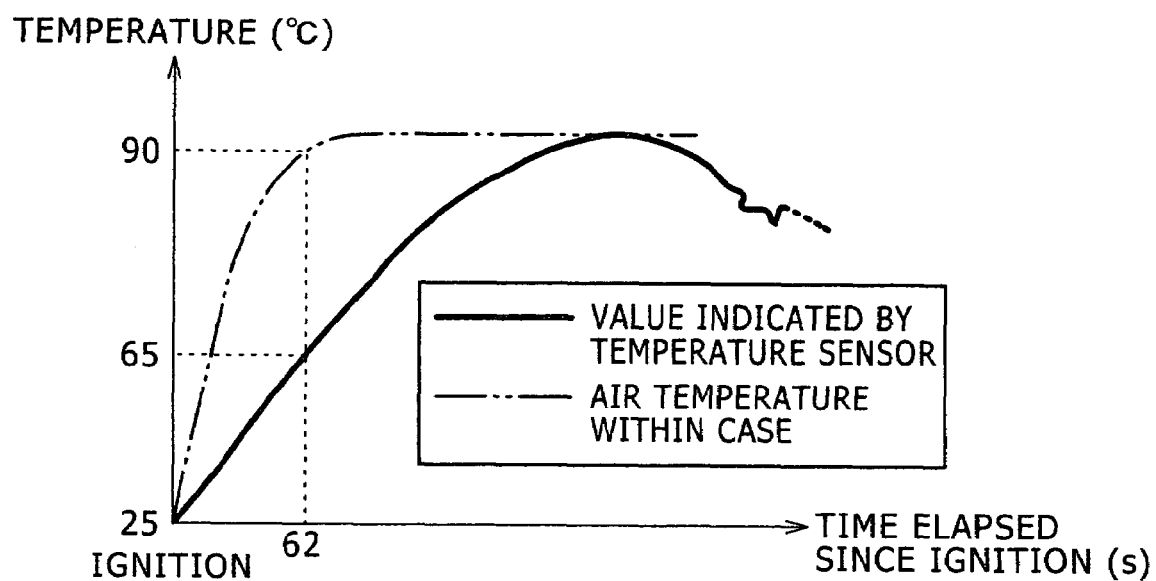
FIG. 6 illustrates air temperature variations in a temperature sensor and a case when abnormality is determined according to the absolute temperature.
Figure 7:
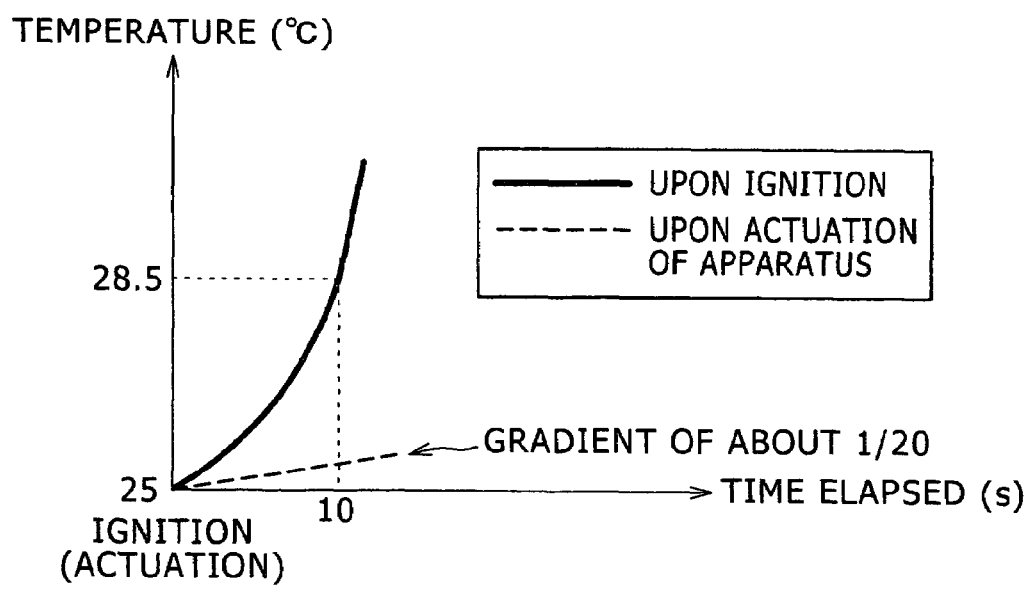
FIG. 7 illustrates determination of abnormality according to temperature variations.
Figure 8A:
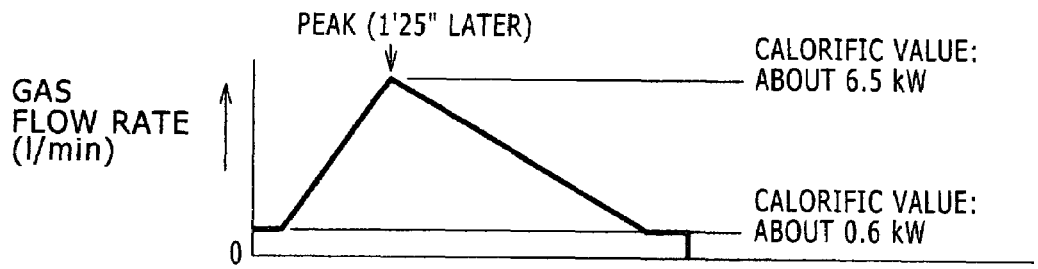
FIGS. 8A to 8C illustrate the methane gas flow rate profile, the air flow rate of the fan and the air temperature in the case after ignition.
Figure 8B:
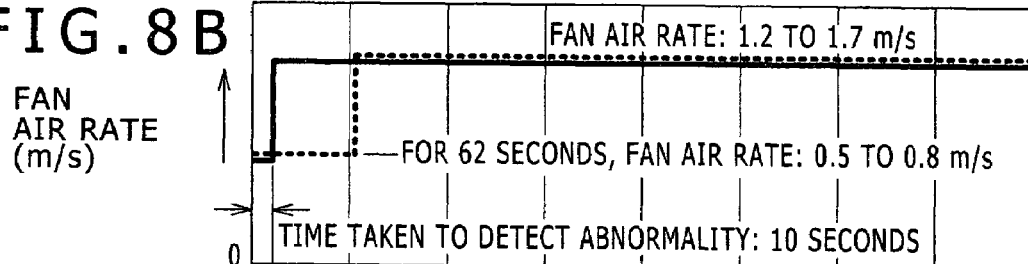
Figure 8C:
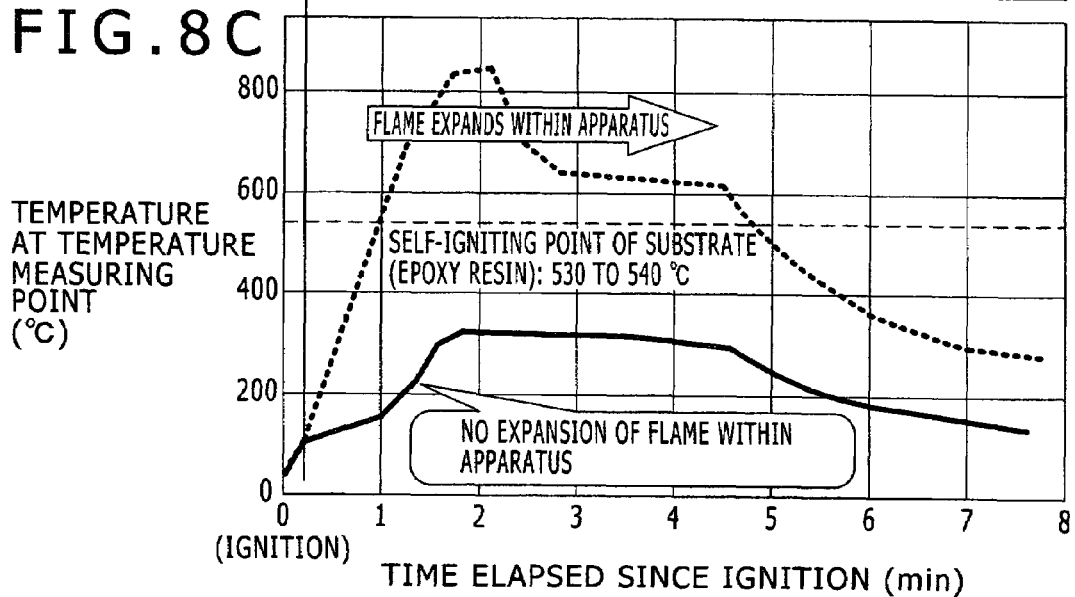

Modes for implementing the present invention will be described by way of a preferred embodiment thereof with reference to the drawings. Substantially the same elements will be assigned the same reference numbers, respectively, and their description will not be repeated. Herein, FIGS. 1A and 1B show a perspective view of an electronic apparatus; FIG. 2 shows a perspective profile of the electronic apparatus; FIG. 3 is a block diagram illustrating fan control; FIG. 4 is a block diagram illustrating the contents of a memory; FIG. 5 is a flowchart illustrating control of the frequency of fan revolutions regarding determination of abnormality; FIG. 6 illustrates air temperature variations in a temperature sensor and a case when abnormality is determined according to the absolute temperature; FIG. 7 illustrates determination of abnormality according to temperature variations; and FIGS. 8A to 8C illustrate the methane gas flow rate profile, the air flow rate of the fan and the air temperature in the case after ignition.

Referring to FIG. 1A an electronic apparatus 100 has, from bottom to top, plural cooling fans 4, plural substrates 3 and plural temperature sensors 1 arranged within a case 5 of width a (m), length b (m) in and height c (m). The cooling fans 4 are arranged in parallel to the xy plane and blow air in the z direction. The substrates 3 are arranged in parallel to the yz plane and are cooled by the air blown by the fans 4. The temperature sensors 1, arranged above the substrates 3, monitor the temperature of exhaust air. The cooling fans 4 and the temperature sensor 1 are connected to a temperature control board 2 disposed in a cell section 5a in the upper part of the case 5, and the air flow rates of the cooling fans 4 are controlled, dependent on the temperatures detected by the temperature sensors 1. Each of the cooling fan assemblies 4 has two fans 41 arranged in the back-and-forth directions as shown in FIG. 1B.

The mounting pitch of the substrates 3 ranges from 17.5 to 26 mm. The installation pitches (a2) of the temperature sensors 1 are 70 mm. Thus each of the temperature sensors 1 monitors three to five substrates.

Referring to FIG. 2, an air intake port (not shown) is provided underneath the front panel 5b of the case 5. Similarly, an air exhaust port (not shown) is disposed above the rear panel 5c of the case 5. Therefore, the air within the case 5 flows as indicated by arrows, from the cooling fan assemblies 4 to between the substrates 3, to the temperature sensors 1 and finally to the air exhaust port.

The plurality of substrates 3 are mounted by inserting into a connector 7 disposed on a back panel 6 from the front panel 5b side. Since the temperature control board 2 is placed in the cell section 5a, it is structured in isolation from the flow of air (namely the flow of heat). This positioning reflects the extreme importance of the temperature control board in the electronic apparatus wherein flame expansion is prevented by appropriately controlling the fans.

Referring to FIG. 3, a central processing unit (CPU) 21 connected to a bus 24, a main memory (MM) 22, an input/output unit (I/O) 23, an A/D converter 25 and a D/A converter 26 are mounted on the temperature control board 2. The temperature sensors 1, of which n units are provided, are connected to the A/D converter 25. The fans 41, of which m units are provided, are connected to the D/A converter 26.

Referring to FIG. 4, a control program 221, the temperature data 222 and a prescribed value 223 are stored in the memory 22. The temperature data 222 include, for each temperature sensor, the latest data (current data), immediately previous data and second previous data. The prescribed value 223 includes a prescribed temperature difference (Td). In the prescribed value 223 row of FIG. 4, only the value relevant to the flame exposure test is stated, and no value relevant to normal operation is given. Temperature data may be preserved as long as the duration of the flame exposure test.

Operations presupposing the flame exposure test will be described below with reference to FIG. 3 and FIG. 4. The CPU 21 executes a control program recorded in the memory 22, and captures the readings of n temperature sensors into the temperature data 222 every 1.6 seconds (one cycle). The CPU 21, when it finds any one of the temperature sensors 1-1 through 1-n satisfying the condition to be stated afterwards in the temperature history at three past points, determines abnormality. Having determined abnormality, the CPU 21 causes all the fans 41-1 through 41-m to run at high speed (1.2 to 1.7 m/s in wind velocity). The CPU 21 issues an abnormal temperature notification to external apparatuses via the I/O 23 to have alarm lamps lit. Also the CPU 21, when the internal temperature has further risen, instructs every substrate 3 to cut off power supply.

After transition to high speed operation, the CPU 21 maintains that high speed operation for five cycles (eight seconds) and, when it finds all of the temperature sensors 1-1 through 1-n satisfying the condition to be stated afterwards in the temperature history at three past points, determines normality. The CPU 21 causes all the fans 41 to run at low speed dependent on the current sensor-detected temperature (0.5 to 0.8 m/s in wind velocity). Incidentally, the prescribed values and other factors for abnormality detection and the determination algorithm can be easily altered by changing the pertinent firmware.

Control of the frequency of fan revolutions regarding determination of abnormality will now be described with reference to FIG. 5. When the electronic apparatus is actuated, the CPU 21 collects temperature data from all the temperature sensors and writes them into the memory. The CPU 21 performs this operation every 1.6 seconds (one cycle) and continues to do so until the electronic apparatus stops.

Three cycles of temperature data collection are taken. Referring to FIG. 5, the CPU 21 determines for each sensor whether or not the difference between the currently measured temperature and the temperature at the second previous time is equal to or above a prescribed value Td (S110). If it is not for any sensor, the control will shift to step 150. If there is any sensor for which the answer is Yes at step 110, the CPU 21 will determine for the pertinent sensor whether or not the difference between the temperature measured at the immediate previous time and the temperature at the second previous time is greater than 0.0° C. (S120). If it is not, the control will shift to step 150. If the answer is Yes at step 120, the CPU 21 will determine abnormality and cause every fan to shift to high speed operation (S130).

The CPU 21, while keeping the fans at high speed operation, performs temperature measurement for five cycles (eight seconds), and return to step 110 (S140). If the answer is No at step 110 or step 120, the CPU 21 will return to step 110 after reducing the fan speed to a level matching the average of the temperatures measured by the sensors (S150).

Incidentally, the present inventors adopted 2.0° C. as the prescribed value Td. This prescribed value Td applies where an incombustible material is used, and the value should be smaller where some other material is used for the printed circuit board. Further, step 120 is dispensable. Incidentally, where no control signal from the temperature control board 2 shown in FIGS. 1A, 1B and FIG. 2 can be received, the plurality of cooling fan assemblies 4 autonomously turn at high speed. Also, abnormality can as well be determined by two-cycle temperature measurement.

The temperature rise characteristic dependent on the difference in abnormality determination will now be described with reference to FIG. 6 and FIG. 7.

In FIG. 6, the solid line represents the reading of the temperature sensor in the upper part of the vicinity of the burner inserting position, and the two-dot chain line, the air temperature around the temperature sensor. The air temperature here was experimentally measured with a thermocouple. In the representation in FIG. 6, when the temperature sensor reading has reached 65° C., which is the usual detection temperature of a common constant-temperature type fire sensor, the state is supposed to be abnormal. This 65° C. was also figured out from the upper limit of the ambient temperature and the upper limit of the temperature rise due to the heating of the electronic apparatus itself. This abnormality was detected in 62 seconds after the insertion of the burner (ignition). On the other hand, the temperature of the air flowing within the case, as measured by the thermocouple with a low time constant, had already reached 90° C. The detection of abnormality caused all the fans to start high speed revolutions, and the air temperature around the temperature sensor remained at 100° C.

In FIG. 7, the solid line represents the reading of the temperature sensor in the upper part of the vicinity of the burner inserting position, and the broken line represents the reading of the temperature sensor at the time of actuating the apparatus, which is the highest in normal operation. Incidentally, the solid line in FIG. 7 is an expanded view of the portion near the origin of the solid line in FIG. 6. As represented in FIG. 7, abnormality was detected at 28.5° C. in 10 seconds after ignition, and then all the fans started high speed revolutions. In this case, the air temperature at the time of abnormality detection remained below 65° C. with reference to FIG. 6. The detection of no abnormality in 3.2 seconds after ignition here is attributable to the time lag with the temperature measuring cycle (1.5 seconds at the maximum) and the positional lag between the burner inserting position and the detecting temperature sensor (35 mm at the maximum). Incidentally, the length of time taken from ignition to detect abnormality by a 2° C. temperature rise in 3.2 seconds (0.625° C./second) was 6, 10, 5 and 3 seconds in the inventors' four experiments, all passing the ambience test according to Non-Patent Document 1. The 2° C. temperature rise in 3.2 seconds is equal to or more than 20 times the 0.1° C. temperature rise in 3.2 seconds from the apparatus actuation, which is the greatest temperature rise on normal occasions, and accordingly there is little likelihood of operation error.

As stated above, by having all the fans run at high speed in about 10 seconds after ignition and thereby discharging thermal energy out of the case of the electronic apparatus, expansion of fire within the electronic apparatus can be prevented. To add, since the fire is not extinguished, the two substrates directly exposed to the flame are charred, but they do not take fire. This point will be further described with reference to FIGS. 8A to 8C.

FIG. 8A shows a profile of methane gas supplied to the burner, whose details were described with reference to the related art; FIG. 8B illustrates a difference in fan air rate dependent on a difference in the determination of abnormality detection; and FIG. 8C illustrates the temperature of air flow dependent on a difference in the determination of abnormality detection where a thermocouple is arranged immediately above the burner.

The calorific value of the test described above with reference to FIG. 8A was about 0.6 kW at the start and end of the test and about 6.5 kW at the peak.

FIG. 8B shows fan air rates, with a case where the sensor reading of 65° C. was used as the abnormality detection temperature (the broken line) being compared with another case where a 2° C. or more sensor reading rise 3.2 seconds afterwards was considered abnormal (the solid line). In the former, it took the fan air rate 62 seconds from ignition to rise from the range of 0.5 to 0.8 m/s to that of 1.2 to 1.7 m/s, followed by a sustained fan air rate range of 1.2 to 1.7 m/s. In the latter, the fan air rate began to rise 10 seconds after ignition, and the increased air flow rate was maintained.

In the case represented by the dotted line in FIG. 8C, wherein the temperature sensor reading of 65° C. was supposed to be the abnormality detection temperature, the air temperature above the burner surpassed 530° C. to 540° C., the self-igniting point of the epoxy substrate within one minute. By this time, the epoxy material of the substrates on the two sides of the burner had caught fire. As a result, the fans turning at high speed were supplying air, resulting in continued expansion of fire within the apparatus. On the other hand, in the case represented by the solid line in FIG. 8B, wherein a 2° C. or more sensor reading rise 3.2 seconds afterwards was considered abnormal, as the fan air rate rose to the range of 1.2 to 1.7 m/s 10 minutes afterwards, heat absorption by the substrates on the two sides of the burner was inhibited. As a result, the air temperature above the burner was no more than about 350° C. even at the peak, and this datum suggests that even if the substrates and components on the two sides of burner catch fire, no self-ignition will occur.

On the solid line in FIG. 8C, the peak temperature is 350° C. reached 1 minute and 45 seconds after ignition. When the solid line in FIG. 8C is shifted upward along the vertical axis until the peak comes into contact with the broken line of 535° C. on the vertical axis while keeping its profile shape unchanged, the profile of the shifted solid line and the profile of the broken line cross each other at the temperature of 350° C. about 40 seconds after ignition. Therefore, in the 0-th approximation, if the fan air rate is increased within 40 seconds after ignition, presumably no expansion of burning will occurs. However, considering that the gas flow rate begins to increase 15 seconds after ignition, the inventors judged that 30 seconds after ignition would be the time limit of the increase in fan air rate.

Therefore, a preferable time limit of the increase in fan air rate is 30 seconds after ignition, and an even more preferable time limit is 15 seconds after ignition.

Figure 9:
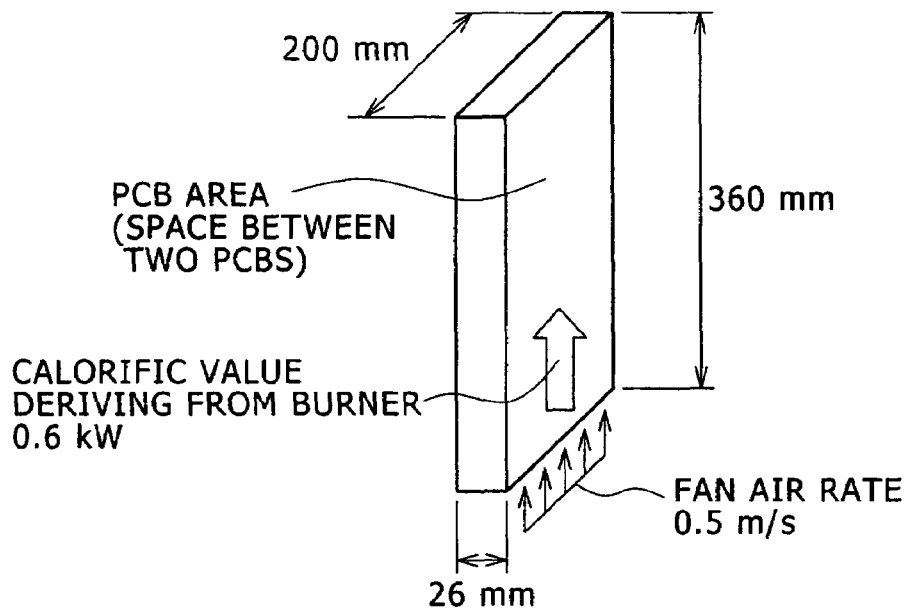
FIG. 9 illustrates a PCB area.

Next, the reason why abnormality should be detected by a 2° C. temperature rise in 3.2 seconds (0.625° C./second) will be explained by citing specific numerical values. First, the space between two PCBs shown in FIG. 9 is supposed to be a space. This space will be called the PCB area.

When a burner is inserted into the PCB area between the two PCBs, the calorific value of the burner is 0.6 kW for 15 seconds after ignition, and the flow rate of air supplied from underneath the PCBs is 0.5 m/s, the rate of normal low speed revolutions. If 10% of the calorific value of the flame from the burner is discharged by the fans out of the PCB area, the following will hold:

$$0.6 \text{ (kW)} \times 0.1 = 60 \text{ (W)} \quad (1)$$

Thus, the calorific value discharged out of the PCB area will be 60 W, and this can be regarded as meaning the discharging of a calorific value of 60 J per second because 1 W=1 J/s.

Figure 10:
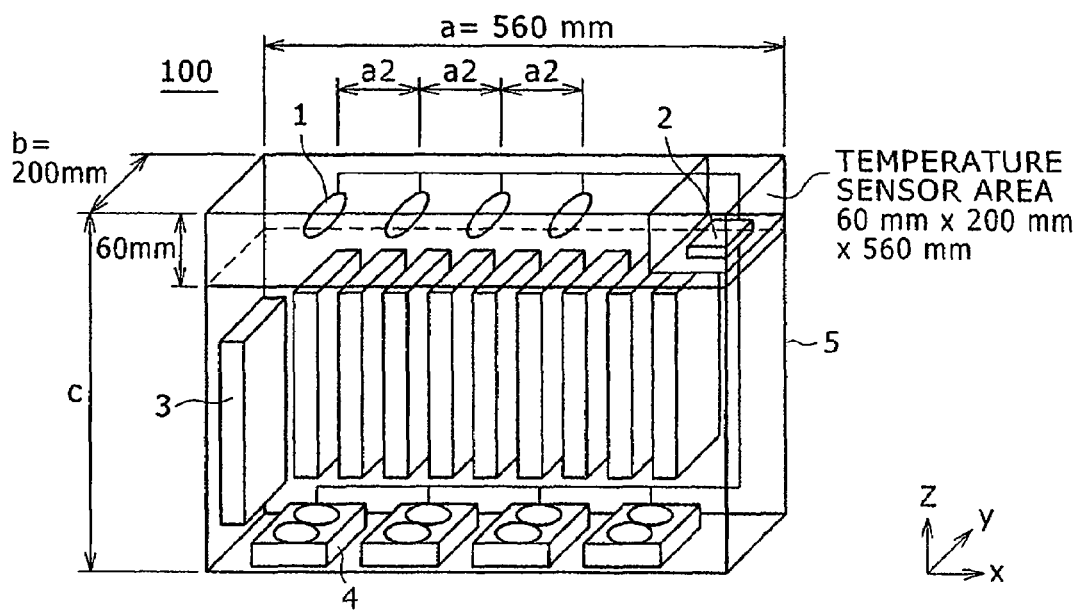
FIG. 10 illustrates a temperature sensor area.

The calorific value discharged out of the PCB area invades into the temperature sensor area shown next in FIG. 10. The temperature sensor area is supposed to measure 60 mm from the upper end face of the substrate to the top plate of the case, 200 mm in the length of the case and 560 mm in the width of the case. Then the cubic measure of the temperature sensor area is:

$$0.06 \text{ (m)} \times 0.2 \text{ (m)} \times 0.56 \text{ (m)} = 0.00672 \text{ (m3)} \quad (2)$$

Therefore, the mass of the air in the temperature sensor area is:

$$0.00672 \text{ (m3)} \times 1.2 \text{ (kg/m3)} \approx 0.008 \text{ (kg)} \quad (3)$$

The relationship between temperature variations and the increase or decrease of the calorific value can be expressed in the following equation:

$$\text{Calorific value (J)} = \text{Specific heat (J/kg·K)} \times \text{mass (kg)} \times \text{temperature variation (K)} \quad (4)$$

The specific heat of air is 1006 J/(kg·K).

Supposing that, when the detecting temperature sensor deviates to the greatest extent relative the burner-inserted part, about 10% of the 60 J per second of calorific value entering into the temperature sensor area is detected by the temperature sensor, the temperature variation per second detected by the temperature sensor will be, according to Equation (4):

$$\begin{aligned}
\text{Temperature variation } (K) &= \text{Calorific value } (J) \div \\
&\quad \text{specific heat } (J/\text{kg} \cdot K) \div \\
&\quad \text{mass (kg)} \\
&= 60 \times 0.1 \div 1006 \div 0.008 \ (K) \\
&\approx 0.75 \ (K)
\end{aligned} \quad (5)$$

As the threshold of temperature variation for abnormality to be detected by this apparatus is 0.62° C./s, which is smaller than the temperature variation according to Equation (5) above, detection can well be accomplished.

To add, the substrate spacing, sensor spacing and other factors in the embodiment of the invention described with reference to specific numerical values may be different from the foregoing depending on the material of the substrates and components to be mounted. The air flow rate during normal operation and that at the time of abnormality determination may also be different. The threshold of abnormality determination and the number of protective steps for preventing wrong determination, namely how far back temperature data is to be sought for use in determination, can be altered as appropriate by adjusting the firmware.

According to the present invention, an electronic apparatus that can stand the stringent ambience test according to Non-Patent Document 1 can be provided.

We claim:

1. An electronic apparatus comprising a plurality of cooling fans arranged in a lower part of a case, a plurality of temperature sensors arranged in an upper part of said case, and a plurality of electronic substrates so arranged between said cooling fans and said temperature sensors as to secure air flow paths, with an ambience test of inserting an ignition source for a certain length of time into the case, characterized in that:

said electronic apparatus having a control unit that measures at predetermined intervals of time the temperature within the case with said temperature sensors, compares the temperature measured the latest time with the temperature measured at the preceding time for each of said temperature sensors and, if a temperature rising rate measured is greater than a predetermined value for one or more of said temperature sensors, and if the temperature measured at the latest time is higher than the temperature measured at the preceding time for each of said one or more temperature sensor(s), increases an air flow rate of said plurality of cooling fans, wherein said control unit maintains the increased temperatures within the case, which are measured by the temperature sensors, at a temperature of less than the self-igniting point of the electronic substrates, even in the presence of said ignition source.

2. The electronic apparatus according to claim 1, wherein the air flow rate of said cooling fans is increased from a normal range of 0.5 m/s to 0.8 m/s to a range of 1.2 m/s to 1.7 m/s.

3. The electronic apparatus according to claim 1, wherein said control unit increases the air flow rate of said cooling fans and at the same time gives an instruction to cut off power supply to each of said electronic substrates.

4. The electronic apparatus according to claim 1, wherein said predetermined value is 0.625° C./s.

5. The electronic apparatus according to claim 1, wherein said control unit, after keeping the air flow rate of said plurality of cooling fans increased for a few seconds, again measures the temperature within the ease with said plurality of temperature sensors, and determines whether or not to maintain the increase of the air flow rate of said cooling fans on the basis of the result of the measurement.

6. The electronic apparatus according to claim 1, wherein the air flow rate of said cooling fans is increased at least within 10 seconds after the ignition source is inserted into the case.

7. The electronic apparatus according to claim 1, wherein said control unit is installed in a position isolated from said air flow paths.

8. The electronic apparatus according to claim 1, wherein thermal energy of said ignition source is discharged out of the case by increasing the air flow rate of said plurality of cooling fans thereby to prevent the inside of the case from suffering a spread of burning.

9. The electronic apparatus according to claim 1, wherein said plurality of electronic substrates are made of epoxy and said self-igniting point is 540° C.

10. The electronic apparatus according to claim 1, wherein said control unit maintains the increased temperatures within the case, which are measured by the temperature sensors, less than or equal to 350° C., even in the presence of said ignition source.

* * * * *